US012676583B2

(12) United States Patent
Yamaguchi et al.

(10) Patent No.: US 12,676,583 B2
(45) Date of Patent: Jul. 7, 2026

(54) BANDPASS FILTER AND RADAR DEVICE

(71) Applicant: Furuno Electric Co., Ltd., Nishinomiya (JP)

(72) Inventors: Takuya Yamaguchi, Nishinomiya (JP); Keisuke Tanaka, Nishinomiya (JP)

(73) Assignee: Furuno Electric Co., Ltd., Nishinomiya (JP)

(*) Notice: Subject to any disclaimer, the term of this patent is extended or adjusted under 35 U.S.C. 154(b) by 50 days.

(21) Appl. No.: 19/015,560

(22) Filed: Jan. 9, 2025

(65) Prior Publication Data

US 2025/0150051 A1 May 8, 2025

Related U.S. Application Data

(63) Continuation-in-part of application No. PCT/JP2023/021891, filed on Jun. 13, 2023.

(30) Foreign Application Priority Data

Jul. 13, 2022 (JP) ................................. 2022-112411

(51) Int. Cl.
*H03H 7/01* (2006.01)
*H01P 3/08* (2006.01)

(52) U.S. Cl.
CPC ............. *H03H 7/0115* (2013.01); *H01P 3/08* (2013.01); *H03H 7/0123* (2013.01)

(58) Field of Classification Search
CPC ............ H03H 7/0115; H01P 3/08; H01P 1/20
USPC ......................................................... 333/165
See application file for complete search history.

(56) References Cited

U.S. PATENT DOCUMENTS 6,825,742 B1 11/2004 Luque
2020/0176843 A1* 6/2020 Kwok .................. H03H 7/1758

FOREIGN PATENT DOCUMENTS

JP 2004023335 A 1/2004
JP 2007306563 A 11/2007

* cited by examiner

*Primary Examiner* — Andrea Lindgren Baltzell
*Assistant Examiner* — Victor Cole
(74) *Attorney, Agent, or Firm* — Alleman Hall LLP

(57) ABSTRACT

A bandpass filter (includes a dielectric substrate, a first strip line formed on the dielectric substrate, resonators coupled to the first strip line, and a second strip line formed on the dielectric substrate coupled to the resonators. The resonators include a plurality of inductor elements formed on the dielectric substrate and composed of rectangular conductors having a long side direction and a short side direction, and a capacitor element for coupling the plurality of inductor elements and include a series resonance circuit composed of the plurality of inductor elements and the capacitor element. The length in the long side direction of the inductor element is less than half wavelength of the electromagnetic wave transmitted by the filter.

12 Claims, 8 Drawing Sheets

BANDPASS FILTER AND RADAR DEVICE

CROSS-REFERENCE TO RELATED APPLICATION(S)

The present application is a continuation-in-part of PCT/JP2023/21891, filed on Jun. 13, 2023, and is related to and claims priority from Japanese patent application no. 2022-112411, filed on Jul. 13, 2022. The entire contents of the aforementioned application are hereby incorporated by reference herein.

TECHNICAL FIELD

The present disclosure relates to a bandpass filter for high-frequency signals.

BACKGROUND

In the bandpass filter, it is known that an inductor and a capacitor are formed by forming a conductive strip of a transmission line in a predetermined shape.

SUMMARY

However, in that configuration, a desired filter characteristic may not be obtained due to a change in the dielectric constant of the base material (dielectric layer) or the like.

Therefore, an object of the present disclosure is to realize a desired filter characteristic by suppressing the influence of the base material.

A bandpass filter according to a first example of the present disclosure comprises a first strip line that transmits electromagnetic wave, being formed on a dielectric substrate, a resonator being formed on the dielectric substrate comprises a first series resonance circuit coupled to the first strip line, and a second strip line coupled to the resonator and formed on the dielectric substrate.

The first series resonance circuit comprises a plurality of inductor elements each composed of a rectangular conductor whose length in a long side direction is equal to or less than a half wavelength of the electromagnetic wave, and a mount type capacitor element arranged between the plurality of inductor elements and coupled in series to the plurality of inductor elements.

With this configuration, a resonance mode having a uniform current distribution on a line may be excited at the time of series resonance. In short, the series resonance circuit may excite a series zero order resonance. Thus, by making the resonance frequency dependent on the capacitance of the mount type capacitor element, the influence of the base material of the dielectric substrate may be suppressed, and desired filter characteristics may be realized.

In the bandpass filter according to the second example of the present disclosure, a length of a long side of a resonator unit cell formed by an inductor element and the capacitor element is equal to or less than a half the wavelength of the electromagnetic wave.

In this configuration, the series zero-order resonance may be excited by the resonator unit cell of the series resonance circuit. By realizing this resonance mode, the bandpass filter may be formed without depending on the wavelength, and enlargement of the planar shape may be suppressed.

The bandpass filter of the third example of the present disclosure includes the bandpass filter of the first or second example, and the terminal of the capacitor element is coupled in a vicinity of a short side of the inductor element.

In this configuration, the dimension of the first series resonance circuit may be reduced.

The bandpass filter of the fourth example of the present disclosure includes the bandpass filter of either the first or third example, and the resonator further includes a second series resonance circuit positioned parallel to the first series resonance circuit along the long side direction.

In this configuration, the filter characteristic may be more easily achieved to a desired characteristic, for example, to achieve a steeper attenuation characteristic.

A bandpass filter according to a fifth example of the present disclosure includes a bandpass filter according to a fourth example, and both ends of the first series resonance circuit and the second series resonance circuit are coupled to a ground potential.

In this configuration, the current distribution at both ends becomes maximum, and the series zero-order resonance may be excited.

A bandpass filter according to a sixth example of the present disclosure includes any of the bandpass filters according to a first example and a fifth example, and the first strip line and the second strip line have a shape extending along the long side direction and are arranged across the resonator in the short side direction.

In this configuration, electromagnetic waves may be input and output to and from the resonator with a desired coupling degree while suppressing the enlargement of the planar shape.

A bandpass filter according to a seventh example of the present disclosure includes a bandpass filter according to either of the fourth and sixth examples, wherein the resonator comprises a first resonator comprising a first series resonance circuit and a second series resonance circuit, and a second resonator having a configuration equivalent to that of the first resonator, wherein the first resonator and the second resonator are coupled with the first strip line and the second strip line, the first resonator and the second resonator being coupled in parallel.

In this configuration, since the filter includes a plurality of resonators, the filter characteristics may be more easily realized with desired characteristics.

An eighth example bandpass filter of the present disclosure includes a seventh example bandpass filter, and the first strip line includes a first coupling line coupled to the first resonator, a second coupling line coupled to the second resonator, and a first phase adjustment line coupled between the first coupling line and the second coupling line.

In this configuration, the phases of the electromagnetic waves coupled to the first resonator and the electromagnetic waves coupled to the second resonator may be adjusted. Thus, the filter characteristics may be more easily realized with desired characteristics.

A ninth example bandpass filter of the present disclosure includes the eighth example bandpass filter, and the second strip line includes a third coupling line coupled to the first resonator, a fourth coupling line coupled to the second resonator, and a second phase adjustment line coupled between the third coupling line and the fourth coupling line.

In this configuration, the phases of the electromagnetic waves coupled to the first resonator and the electromagnetic waves coupled to the second resonator may be adjusted. Thus, the filter characteristics may be more easily realized with desired characteristics.

The bandpass filter according to example tenth of the present disclosure includes the bandpass filter according to the ninth example, and the first phase adjustment line and the second phase adjustment line are conductors having a meander shape. Thus, the size of the plane shape may be suppressed while the first phase adjustment line and the second phase adjustment line are provided.

A radar device according to the present disclosure includes either of the bandpass filters according to Example 1 and Example 10. In this configuration, a high frequency without unwanted waves may be transmitted, or unwanted waves contained in a received signal may be suppressed.

The bandpass filter according to example twelfth of the present disclosure includes the bandpass filter according to the fifth example, and the first strip line and the second strip line are having a shape that extends along the long side direction.

BRIEF DESCRIPTION OF DRAWINGS

The illustrated embodiments of the subject matter will be best understood by reference to the drawings, wherein like parts are designated by like numerals throughout. The following description is intended only by way of example, and simply illustrates certain selected embodiments of devices, systems, and processes that are consistent with the subject matter as claimed herein.

The present disclosure is illustrated by way of example and not by way of limitation in the figures of the accompanying drawings, in which the like reference numerals indicate like elements and in which.

DETAILED DESCRIPTION OF THE EMBODIMENTS

Figure 1:
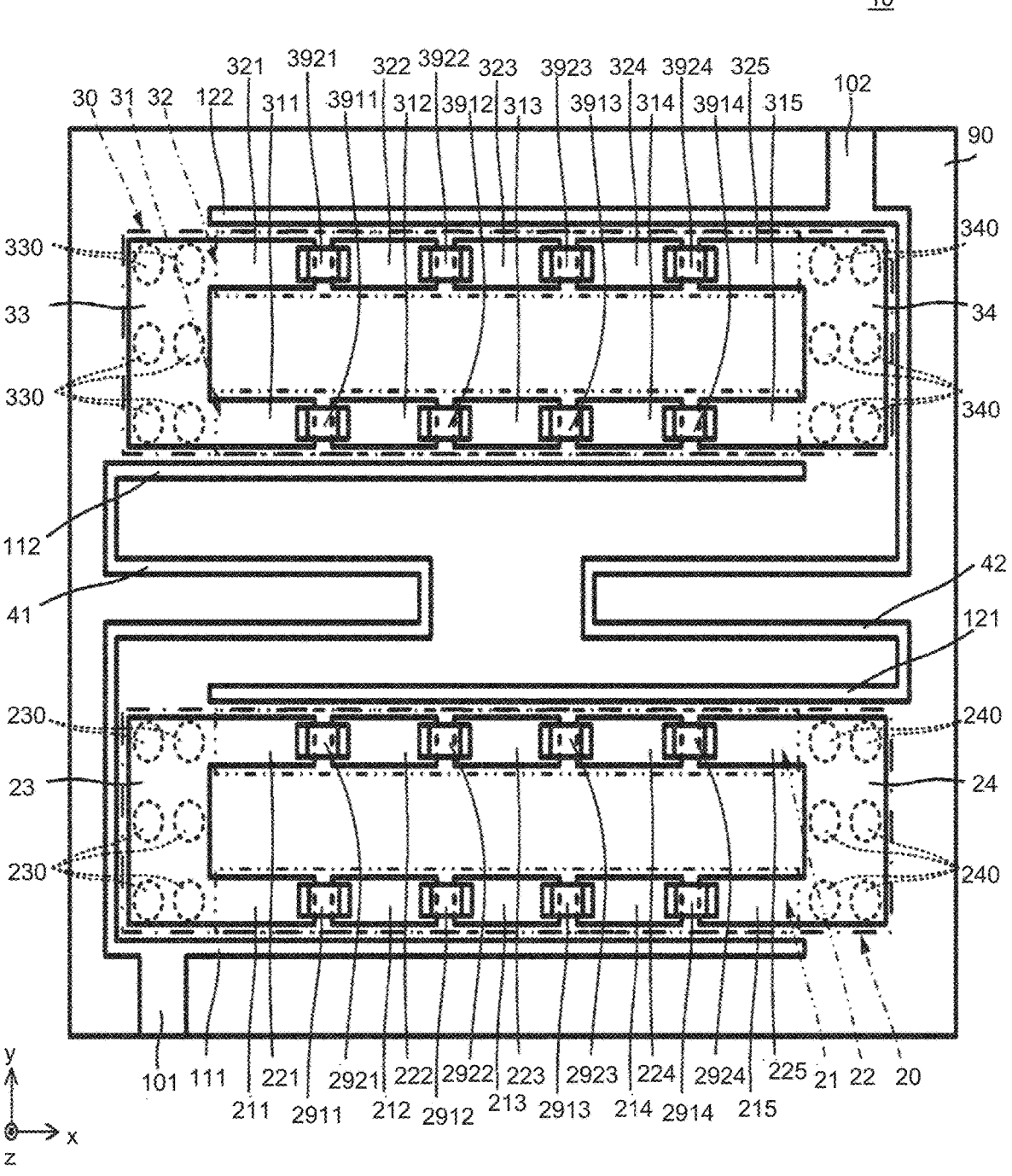
FIG. 1 is a plan view of a filter according to an embodiment of the present disclosure.

Example apparatus are described herein. Other example embodiments or features may further be utilized, and other changes may be made, without departing from the spirit or scope of the subject matter presented herein. In the following detailed description, reference is made to the accompanying drawings, which form a part thereof.

The example embodiments described herein are not meant to be limiting. It will be readily understood that the aspects of the present disclosure, as generally described herein, and illustrated in the drawings, may be arranged, substituted, combined, separated, and designed in a wide variety of different configurations, all of which are explicitly contemplated herein.

Figure 2:
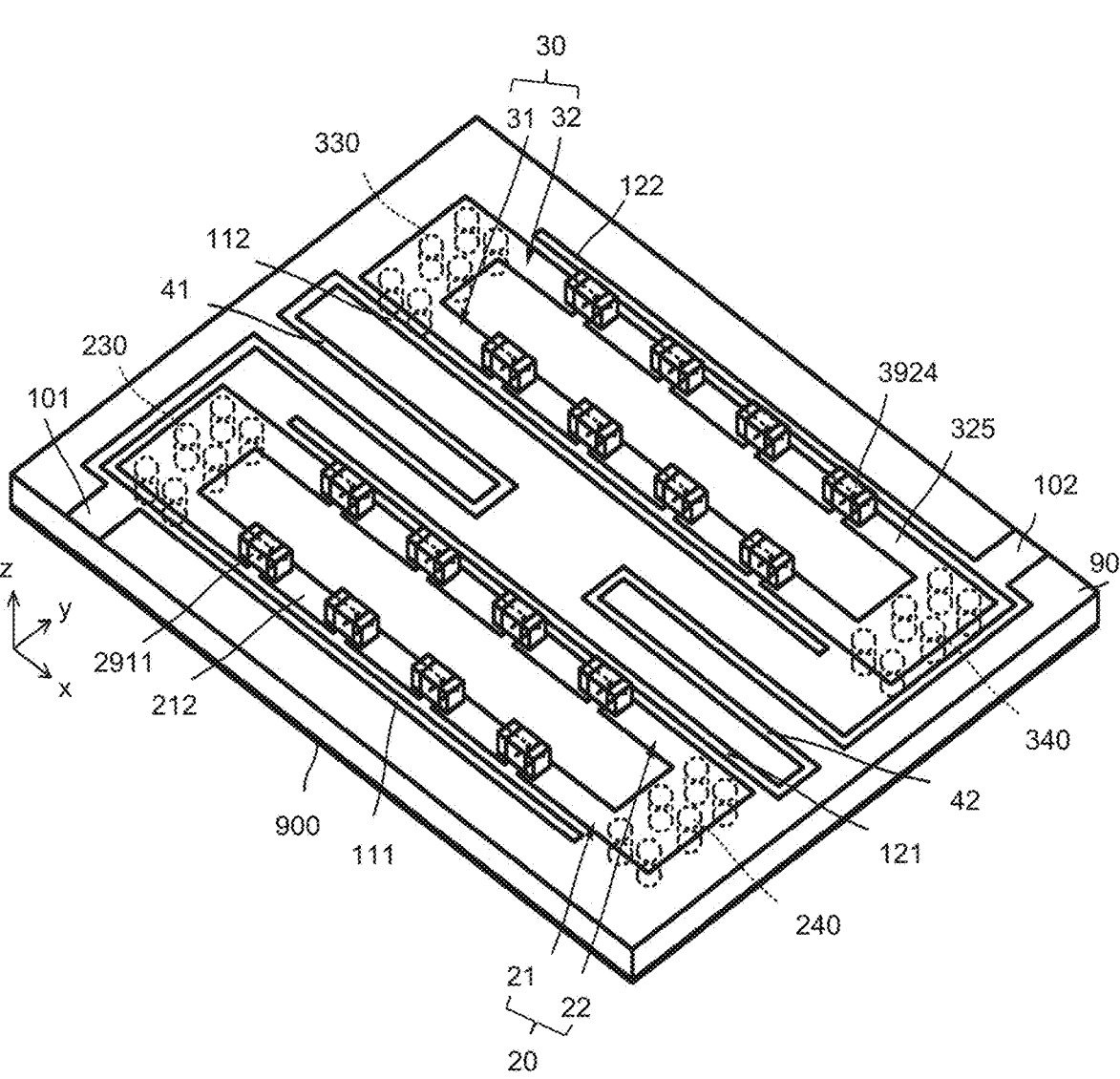
FIG. 2 is a perspective view of a filter according to an embodiment of the present disclosure.
Figure 3:
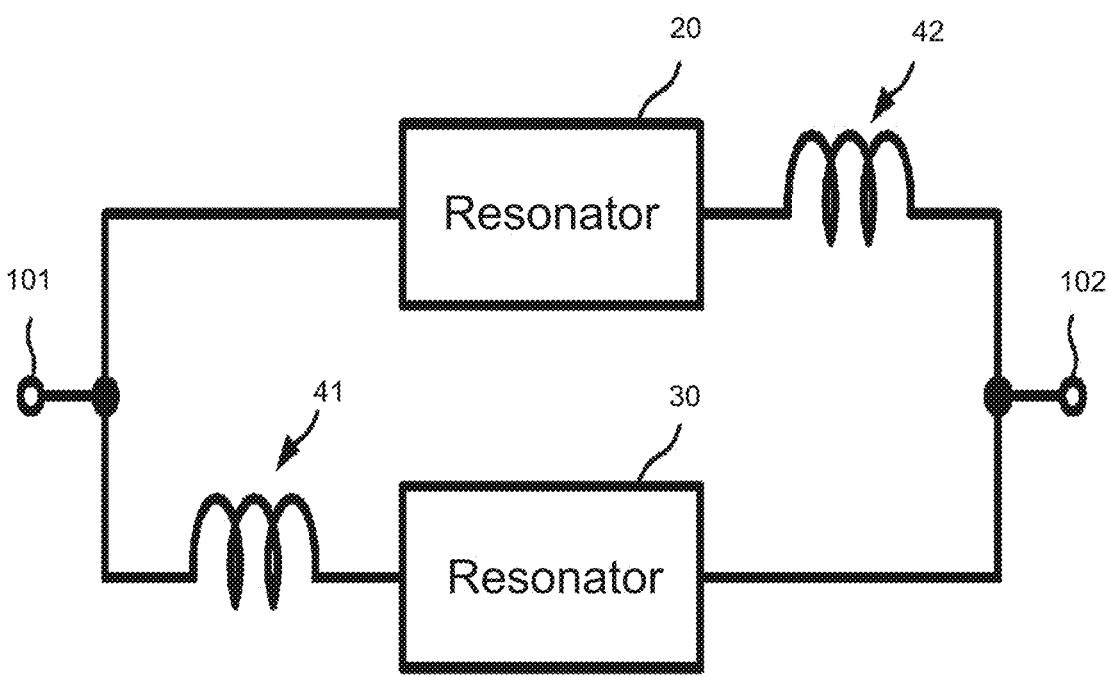
FIG. 3 is an equivalent circuit diagram of a filter according to an embodiment of the present disclosure.

A filter according to an embodiment of the present disclosure will be described with reference to the drawings. FIG. 1 is a plan view of a filter according to an embodiment of the present disclosure. FIG. 2 is a perspective view of a filter according to an embodiment of the present disclosure. FIG. 3 is an equivalent circuit diagram of a filter according to an embodiment of the present disclosure.

(Schematic Configuration of Circuit of Filter 10)

As shown in FIG. 3, the filter 10 includes a resonator 20, a resonator 30, a phase adjustment line 41, a phase adjustment line 42, an input terminal 101, and an output terminal 102.

The resonator 20 and the resonator 30 are coupled in parallel between the input terminal 101 and the output terminal 102. The resonators 20 and 30 have a frequency band to be passed by the filter 10 as a pass band and have attenuation bands on both the high frequency side and the low frequency side of the pass band. The resonator 20 corresponds to the "first resonator" of the present disclosure, and the resonator 30 corresponds to the "second resonator" of the present disclosure.

The phase adjustment line 41 is coupled between the input terminal 101 and the resonator 30. The phase adjustment line 42 is coupled between the resonator 20 and the output terminal 102. The phase adjustment line 41 corresponds to the "first phase adjustment line" of the present disclosure, and the phase adjustment line 42 corresponds to the "second phase adjustment line" of the present disclosure.

In such a configuration, the filter 10 constitutes a bandpass filter having a desired filter characteristic by appropriately setting the passbands and attenuation ranges of the resonators 20 and 30, and appropriately setting the phase adjustment amounts of the phase adjustment lines 41 and 42. Here, the filter characteristic is a characteristic including at least the frequency and frequency width of the passband and the frequency of the attenuation band. The filter characteristic may further include at least one of the frequency of the attenuation pole, the steepness of the attenuation pole, the steepness of both ends of the passband, and the like.

(Configuration of Filter 10)

The filter 10 has the following structure to realize desired filter characteristics.

As shown in FIGS. 1 and 2, the filter 10 includes a dielectric substrate 90, a resonator 20, a resonator 30, a phase adjustment line 41, a phase adjustment line 42, an input terminal 101, an output terminal 102, a coupling line 111, a coupling line 112, a coupling line 121, and a coupling line 122. The coupling line 111, the phase adjustment line 41, and the coupling line 112 constitute a first strip line. The coupling line 121, the phase adjustment line 42, and the coupling line 122 constitute a second strip line.

The dielectric substrate 90 has a front surface and a back surface. The resonator 20, the resonator 30, the phase adjustment line 41, the phase adjustment line 42, the input terminal 101, the output terminal 102, the coupling line 111, the coupling line 112, the coupling line 121, and the coupling line 122 each comprise a linear conductor pattern having a predetermined width and are arranged on the front surface of the dielectric substrate 90. A flat film ground conductor 900 is formed on substantially the entire surface of the back surface of the dielectric substrate 90.

(Structures of Resonators 20 and 30)

The resonator 20 and the resonator 30 have the same configuration. The resonator 20 and the resonator 30 may be appropriately deformed in shape in order to achieve desired filter characteristics by the filter 10. When the resonator 20 and the resonator 30 have the same configuration, it is easy to achieve characteristics that increase steepness from the passband to the attenuation band.

The resonator 20 includes a series resonance circuit 21, a series resonance circuit 22, a connection conductor 23, a connection conductor 24, a plurality of via conductors 230, and a plurality of via conductors 240. The series resonance circuit 21 includes a plurality of inductor elements 211-215 (Inductor element 211, inductor element 212, inductor element 213, inductor element 214, and inductor element 215) and a plurality of capacitor elements 2911-2914 (Capacitor element 2911, capacitor element 2912, capacitor element 2913, and capacitor element 2914).

Each of the plurality of inductor elements 211-215 is formed of a rectangular conductor having a long side direction and a short side direction. The plurality of inductor elements 211-215 are formed on the surface of the dielectric substrate 90 at intervals in the x-axis direction of the dielectric substrate 90. At this time, the plurality of inductor elements 211-215 are formed in a way that the long side direction is parallel to the x-axis direction. In other words, the plurality of inductor elements 211-215 are arranged along the long side direction of the rectangular conductor realizing the respective inductor elements.

The plurality of capacitor elements 2911-2914 are lumped constant chip-type capacitor elements. The plurality of capacitor elements 2911-2914 are mounted on the surface of the dielectric substrate 90 in a way that adjacent inductor elements in the plurality of inductor elements 211-215 are coupled in series.

Specifically, the capacitor element 2911 is coupled to the inductor element 211 and the inductor element 212, and the capacitor element 2912 is coupled to the inductor element 212 and the inductor element 213. The capacitor element 2913 is coupled to the inductor element 213 and the inductor element 214, and the capacitor element 2914 is coupled to the inductor element 214, and the inductor element 215.

With this configuration, the series resonance circuit 21 realizes an LC series resonance circuit in which the plurality of inductor elements 211-215 and the plurality of capacitor elements 2911-2914 are alternately coupled.

The series resonance circuit 22 includes a plurality of inductor elements 221-225 (Inductor element 221, inductor element 222, inductor element 223, inductor element 224, and inductor element 225) and a plurality of capacitor elements 2921-2924 (Capacitor element 2921, capacitor element 2922, capacitor element 2923, and capacitor element 2924).

Each of the plurality of inductor elements 221-225 is formed of a rectangular conductor having a long side direction and a short side direction. The plurality of inductor elements 221-225 are formed on the surface of the dielectric substrate 90 at intervals in the x-axis direction of the dielectric substrate 90. At this time, the plurality of inductor elements 221-225 are formed such that the long side direction is parallel to the x-axis direction. In other words, the plurality of inductor elements 221-225 are arranged along the long side direction of the rectangular conductor realizing the respective inductor elements.

The plurality of capacitor elements 2921-2924 are lumped constant chip type capacitor elements. The plurality of capacitor elements 2921-2924 are mounted on the surface of the dielectric substrate 90 in a way that couple adjacent inductor elements, in the plurality of inductor elements 221-225, in series. Specifically, the capacitor element 2921 is coupled to the inductor element 221 and the inductor element 222, and the capacitor element 2922 is coupled to the inductor element 222 and the inductor element 223. The capacitor element 2923 is coupled to the inductor element 223 and the inductor element 224, and the capacitor element 2924 is coupled to the inductor element 224, and the inductor element 225.

With such a configuration, the series resonance circuit 22 realizes an LC series resonance circuit in which the plurality of inductor elements 221-225 and the plurality of capacitor elements 2921-2924 are alternately coupled.

The connection conductor 23 couples the end of the series resonance circuit 21 on the inductor element 211 side and an end of the series resonance circuit 22 on the inductor element 221 side. The connection conductor 24 couples an end of the series resonance circuit 21 on the inductor element 215 side and an end of the series resonance circuit 22 on the inductor element 225 side. With such a configuration, the resonator 20 has a configuration in which the series resonance circuit 21 and the series resonance circuit 22 are coupled in parallel.

The plurality of via conductors 230 couple the connection conductor 23 and the ground conductor 900. The plurality of via conductors 240 couple the connection conductor 24 and the ground conductor 900. With this configuration, both ends of the resonator 20 are short-circuited to a ground potential. The series resonance circuit 21 and the series resonance circuit 22 may also be coupled to the ground potential by using conductors of different patterns.

Figure 4:
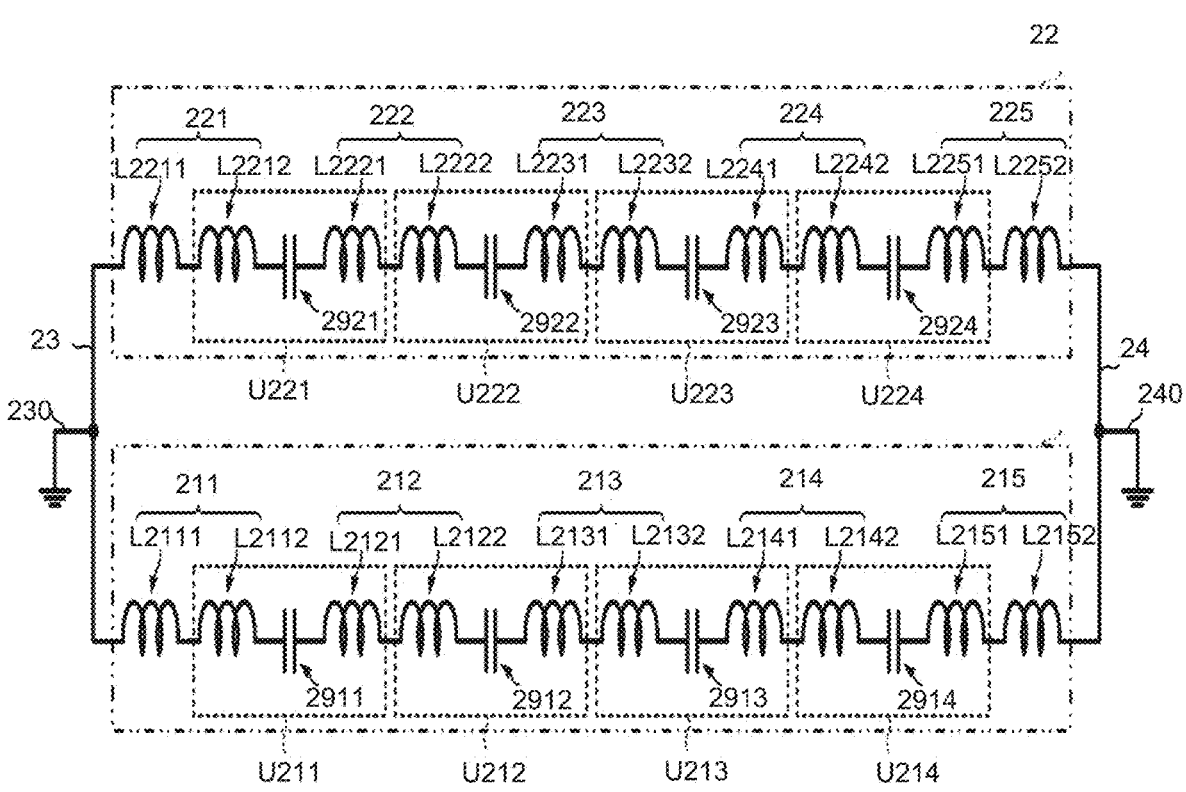
FIG. 4 is an equivalent circuit diagram of a resonator in a filter according to an embodiment of the present disclosure.

The resonator 20 having this configuration is represented by an equivalent circuit as shown in FIG. 4, for example. FIG. 4 is an equivalent circuit diagram of a resonator in the filter according to the embodiment of the present disclosure.

As shown in FIG. 4, in the resonator 20, the series resonance circuit 21 and the series resonance circuit 22 are coupled at one end by a coupling conductor 23. The coupling conductor 23 is coupled to the ground potential by a plurality of via conductors 230. The other ends of the series resonance circuit 21 and the series resonance circuit 22 are coupled by a coupling conductor 24. The coupling conductor 24 is coupled to the ground potential by a plurality of via conductors 240. That is, the resonator 20 has a configuration in which both ends of a parallel circuit of the series resonance circuit 21 and the series resonance circuit 22 are grounded.

Physically, the series resonance circuit 21 includes the plurality of inductor elements 211-215 and the plurality of capacitor elements 2911-2914 as described above. The series resonance circuit 21 is a series circuit in which an inductor element 211, composed of an inductor L2111 and an inductor L2112, and capacitor element 2911, an inductor element 212, composed of an inductor L2121 and an inductor L2122, and a capacitor element 2912, an inductor element 213, composed of an inductor L2131 and an inductor L2132, and a capacitor element 2913, an inductor element 214, composed of an inductor L2141 and an inductor L2142 and a capacitor element 2914, and an inductor element 215, composed of an inductor L2151 and an inductor L2152, are coupled in this order.

The series resonance circuit 21 may be considered as a series connection circuit of, for example, the inductor L2111, a resonator unit cell U211, a resonator unit cell U212, a resonator unit cell U213, a resonator unit cell U214, and the inductor L2152.

The resonator unit cell U211 is an LC series resonance circuit of the inductor L2112, the capacitor element 2911, and the inductor L2121, and resonator unit cell U212 is an LC series resonance circuit of the inductor L2122, the capacitor element 2912, and the inductor L2131. Resonator unit cell U213 is an LC series resonance circuit of the inductor L2132, the capacitor element 2913, and inductor L2141, and resonator unit cell U214 is an LC series reso-nance circuit of the inductor L2142, the capacitor element 2914, and the inductor L2151.

Similarly, the series resonance circuit 22 is considered as a series connection circuit of the inductor L2211, the reso-nator unit cell U221, the resonator unit cell U222, the resonator unit cell U223, the resonator unit cell U224, and the inductor L2252, for example.

The resonator unit cell U221 is an LC series resonance circuit of the inductor L2212, the capacitor element 2921, and the inductor L2221, and the resonator unit cell U222 is an LC series resonance circuit of the inductor L2222, the capacitor element 2922, and the inductor L2231. The reso-nator unit cell U223 is an LC series resonance circuit of the inductor L2232, the capacitor element 2923, and the induc-tor L2241, and the resonator unit cell U224 is an LC series resonance circuit of the inductor L2242, the capacitor ele-ment 2924, and the inductor L2251.

The resonator 30 includes a series resonant circuit 31, a series resonant circuit 32, a coupling conductor 33, a cou-pling conductor 34, a plurality of via conductors 330, and a plurality of via conductors 340. The series resonant circuit 31 includes a plurality of inductor elements 311-315 (Induc-tor element 311, inductor element 312, inductor element 313, inductor element 314, and inductor element 315), and a plurality of capacitor elements 3911-3914 (Capacitor ele-ment 3911, capacitor element 3912, capacitor element 3913, and capacitor element 3914).

The general configuration of the resonator 30 is the same as that of the resonator 20, and a detailed description thereof will be omitted.

The series resonance circuit 31 is an LC series resonance circuit comprising a plurality of inductor elements 311-315 and a plurality of capacitor elements 3911-3914, and the series resonance circuit 32 is an LC series resonance circuit comprising a plurality of inductor elements 321-325 and a plurality of capacitor elements 3921-3924.

The series resonance circuit 31 and the series resonance circuit 32 are coupled in parallel using the connection conductor 33 and the connection conductor 34, and both ends of the parallel circuit, that is, both ends of the resonator 30 are coupled to the ground potential through the plurality of via conductors 330 and the plurality of via conductors 340.

The resonators 20 and 30 run in parallel along the x-axis direction (Long side direction of each inductor element and direction in which the series resonance circuit extends). In other words, the resonators 20 and 30 are arranged at intervals in the y-axis direction (the short side direction of each inductor element) orthogonal to the x-axis direction.

At this time, the resonators 20 and 30 are arranged in a way that the series resonance circuit 22 and the series resonance circuit 31 face each other. In other words, the resonators 20 and 30 are arranged in the order of the series resonance circuit 21, the series resonance circuit 22, the series resonance circuit 31, and the series resonance circuit 32 in the y-axis direction.

(Input/Output Structure of Electromagnetic Wave (High Frequency Signal) to Resonator 20 and Resonator 30)

The input terminal 101 and the output terminal 102 are conductors having a predetermined planar shape (rectangu-lar in the figure). The input terminal 101 is arranged on the opposite side of the resonator 30 with respect to the reso-nator 20 in the y-axis direction. The output terminal 102 is arranged on the opposite side of the resonator 20 with respect to the resonator 30 in the y-axis direction. That is, the input terminal 101 and the output terminal 102 are arranged at positions sandwiching the resonator 20 and the resonator 30 in the y-axis direction.

The coupling line 111, the coupling line 112, the coupling line 121, and the coupling line 122 are linear conductors (strip lines) extending in the x-axis direction (the long side direction of each inductor element).

The coupling line 111 is arranged close to the series resonance circuit 21 and along the direction in which the series resonance circuit 21 extends. The coupling line 111 is arranged close to each of the plurality of inductor elements 211-215 constituting the series resonance circuit 21. The coupling line 111 is coupled to the input terminal 101.

The coupling line 121 is arranged close to the series resonance circuit 22 and along the direction in which the series resonance circuit 22 extends. The coupling line 121 is arranged close to each of the plurality of inductor elements 221-225 constituting the series resonance circuit 22.

The coupling line 112 is arranged close to the series resonance circuit 31 and along the direction in which the series resonance circuit 31 extends. The coupling line 112 is arranged close to each of the plurality of inductor elements 311-315 constituting the series resonance circuit 31.

The coupling line 122 is arranged close to the series resonance circuit 32 and along the extending direction of the series resonance circuit 32. The coupling line 122 is arranged close to each of the plurality of inductor elements 321-325 constituting the series resonance circuit 32. The coupling line 122 is coupled to the output terminal 102.

The phase adjustment line 41 and the phase adjustment line 42 are meandered linear conductors (striplines). The phase adjustment line 41 and the phase adjustment line 42 are arranged between the resonators 20 and 30 in the y-axis direction.

The phase adjustment line 41 is coupled between the input terminal 101 and the coupling line 112. The phase adjust-ment line 42 is coupled between the coupling line 121 and the output terminal 102.

The phase adjustment line 41 and the phase adjustment line 42 are arranged such that the long side direction of the meander shape is parallel to the x-axis direction (the direc-tion in which the series resonance circuit extends).

Operation (Signal Processing) of the Filter 10

The filter 10 inputs a high-frequency signal from the input terminal 101. The high-frequency signal is distributed to the coupling line 111 and the phase adjustment line 41 and transmitted to them, respectively.

The high-frequency signal input to the coupling line 111 is supplied from the coupling line 111 to the resonators 20 (the series resonance circuit 21 and the series resonance circuit 22). The resonator 20 passes a target frequency component of the high-frequency signal and attenuates other frequency components. The high-frequency signal filtered by the resonator 20 is extracted from the coupling line 121. The high-frequency signal extracted by the coupling line 121 is transmitted to the output terminal 102 through the phase adjustment line 42.

The high-frequency signal transmitted through the phase adjustment line 41 is input to the coupling line 112. The high-frequency signal input to the coupling line 112 is supplied from the coupling line 112 to the resonator 30 (series resonance circuit 31 and series resonance circuit 32). The resonator 30 passes the target frequency component of the high-frequency signal and attenuates the other frequency components. The high-frequency signal filtered by the reso-nator 30 is extracted from the coupling line 122. The high-frequency signal extracted out from the coupling line 122 is transmitted to the output terminal 102.

The high-frequency signal from the phase adjustment line 42 and the high-frequency signal extracted by the coupling line 122 are combined at the output terminal 102 and output to the outside of the filter 10.

Figure 5:
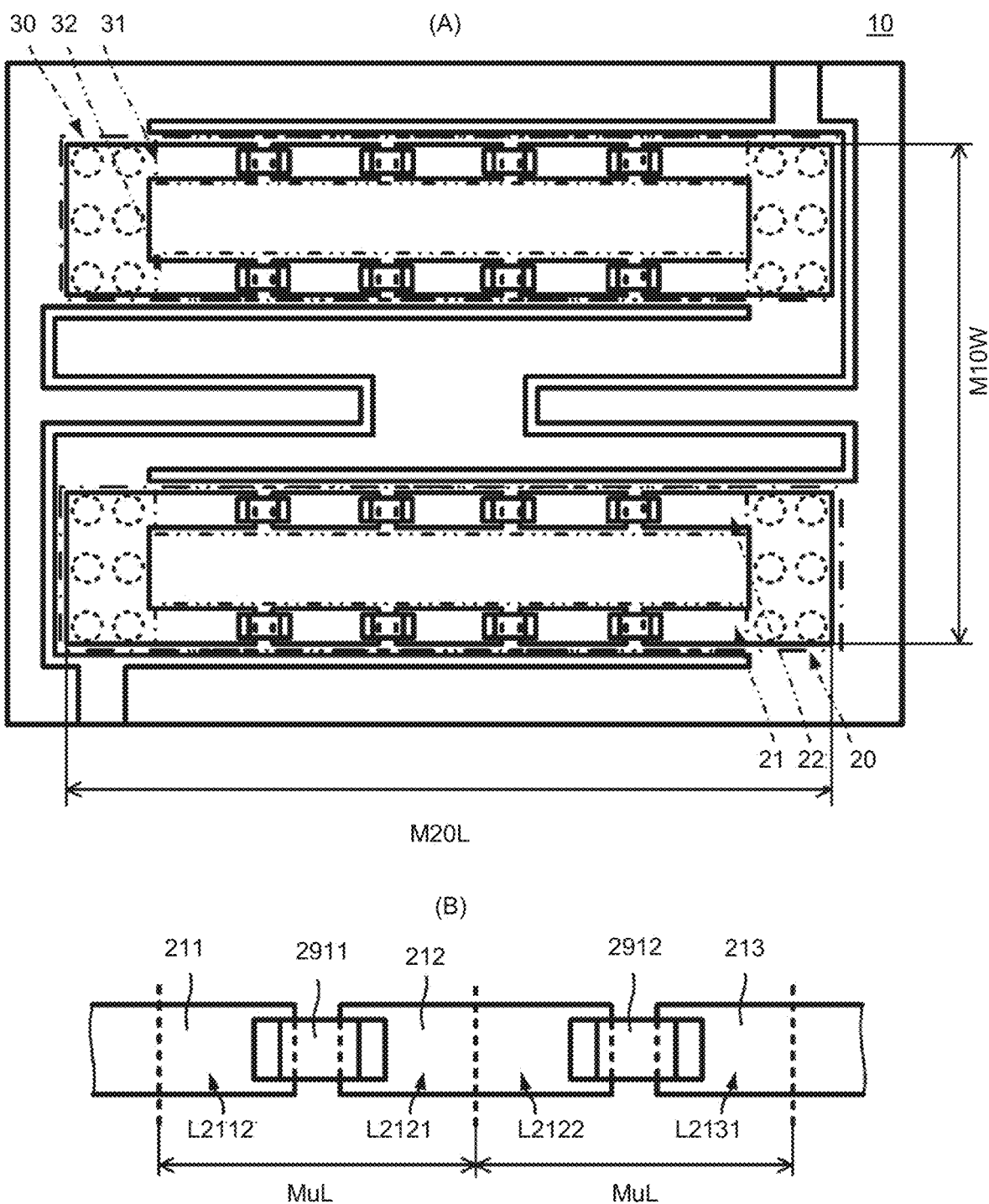
FIG. 5 is diagrams showing respective dimensions of a filter according to an embodiment of the present disclosure.

In such a configuration, each component of the filter 10 is realized with the following dimensions. FIG. 5 is diagrams showing each dimension of the filter according to the embodiment of the present disclosure.

The length (for example, the lengths of the series resonant circuits 21 and 22 constituting the resonator 20 shown in FIG. 5 at (A)) M20L of the resonator 20 is shorter than half of the wavelength of the high-frequency signal transmitted by the filter 10, particularly the high-frequency signal of the passband of the filter 10. In other words, when the length M20L of the resonator 20 is about 25 mm, the frequency of the passband of the resonator 20 is about 2.1 GHz.

In addition, both ends of the resonator 20 are short-circuited to the ground potential.

Further, the inductance L and the capacitance C of each resonator unit cell are set to satisfy Equation 1 with respect to the angular frequency @ of the high-frequency signal of the passband of the filter 10.

For example, in the case of the resonator unit cell U211 shown in FIG. 5 at (B), the combined inductance of the inductor L2112 and the inductor L2121 are made of a rectangular conductor and the capacitance of the capacitor element 2911 are set to satisfy Equation 1.

At this time, the length MuL of the resonator unit cell is made sufficiently shorter than the wavelength of the high-frequency signal in the passband of the filter 10 in such a way that the length M20L of the resonator 20 is shorter than half of the wavelength of the high-frequency signal in the passband of the filter 10. For example, when the frequency of the passband is about 2.1 GHZ, the length MuL of the resonator unit cell is set to be about 4 mm. It should be noted that the present disclosure is not limited to a specific frequency band of microwaves, and the same effect may be obtained if the present configuration is achieved from micro-waves to visible light.

Thus, the resonator 20 is constituted by coupling a plu-rality of resonator unit cells U211 to U214 in series, and it is possible to realize a series zero order resonator in which both ends are short-circuited to the ground potential. The series zero order resonator may be realized by a structure (metamaterial) composed of components sufficiently smaller than the wavelength of a high-frequency signal to be trans-mitted. Therefore, in the resonator 20, the electromagnetic field distribution by the high-frequency signal is uniform regardless of the position in the longitudinal direction, and the phase of the high-frequency signal may excite in-phase resonance at each position in the longitudinal direction.

By utilizing this phenomenon, a structure independent of the length of the resonator 20 may be realized. Furthermore, since both ends of the resonator 20 for realizing a series zero order resonator are short-circuited terminals, the current becomes dominant over the voltage, and the magnetic field is uniformly distributed.

As a result, the length of the resonator 20 in the direction in which the series resonance circuits 21 and 22 extend may be shortened without depending on the wavelength corre-sponding to the frequency of the passband of the high-frequency signal. Therefore, the resonator 20 may be made small.

The resonator 30 has the same configuration as the resonator 20. The same configuration means that the resonator 30 and the resonator 20 have physically the same configuration (the same configuration), if the resonators have at least the same frequency characteristics with respect to the high-frequency signals. In this case, the range of the manufacturing error and the like is within the range of the equivalent configuration. Therefore, the filter 10 may shorten the length in the extending direction of the resona-tors 20 and 30 without depending on the wavelength corre-sponding to the frequency of the pass band of the high-frequency signal. Thus, the filter 10 may be made smaller.

Figures 6, 7:
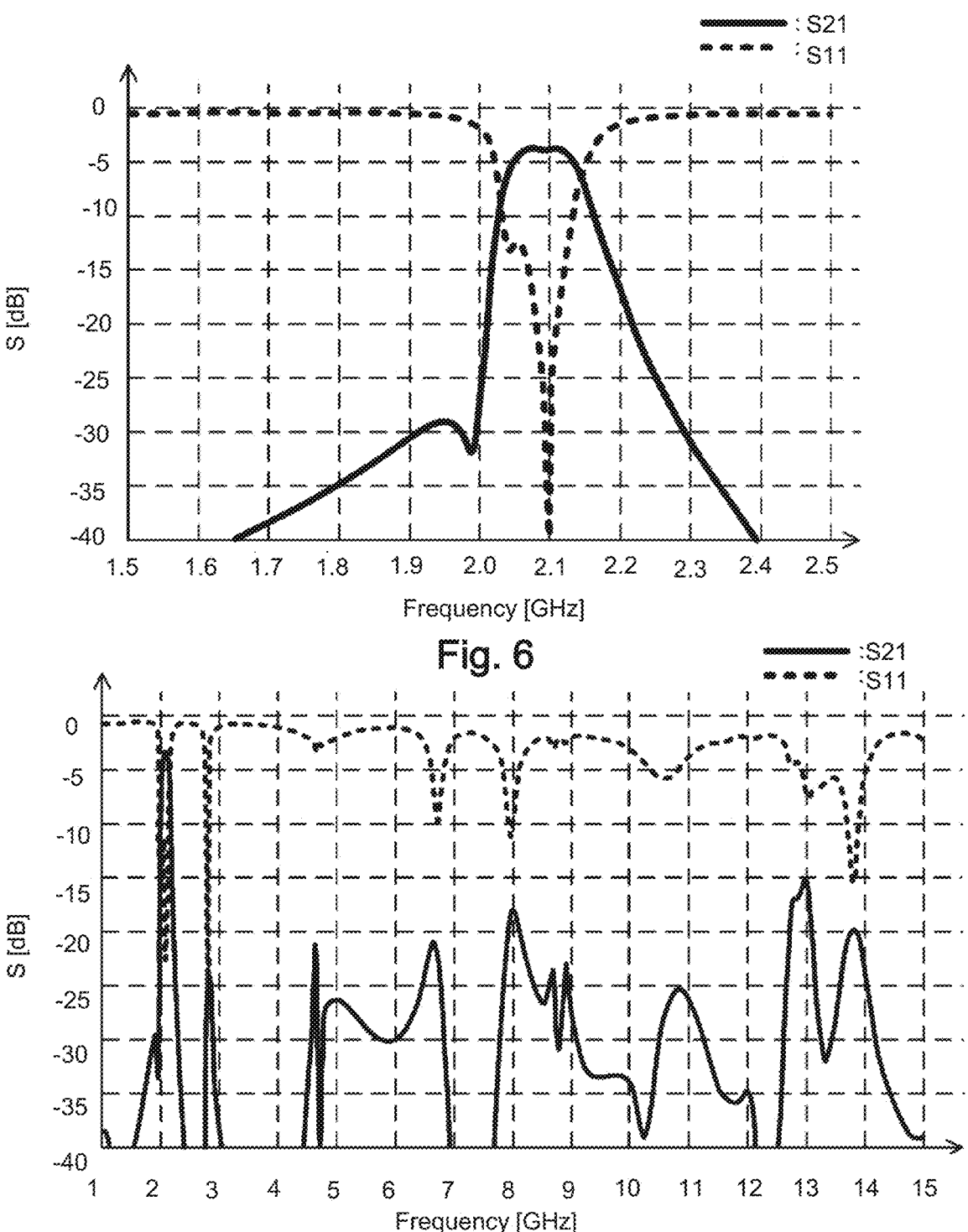
FIG. 6 is a graph showing S11 and S21 characteristics of a filter according to an embodiment of the present disclosure.
FIG. 7 is a graph showing S11 and S21 characteristics of a filter according to an embodiment of the present disclosure.

With such a configuration, the filter 10 may realize filter characteristics as shown in FIG. 6, for example. FIG. 6 is a graph showing S11 characteristics and S21 characteristics of the filter according to the embodiment of the present dis-closure.

As shown in FIG. 6, by providing the configuration of the filter 10, it is possible to realize filter characteristics in which a frequency band of 2.1 GHZ, which is a desired frequency, is used as a pass band and other frequency bands are used as attenuation bands. The filter 10 may be formed in a small size without being affected by the desired frequency.

Further, the filter 10 comprises a parallel connection circuit of the resonator 20 and the resonator 30. This makes it possible to increase the amount of attenuation in the attenuation region (For example, about 1.90 GHz band) on the low-pass side of the passband.

Further, by arranging the phase adjustment lines 41 and 42 for the resonators 20 and 30, the phase difference between the high-frequency signal input to the resonator 20 and the high-frequency signal input to the resonator 30 may be adjusted. This makes it possible for the filter 10 to further increase the amount of attenuation in the attenuation region on the low-pass side of the passband.

In the filter 10, both ends of the resonator 20 are short-circuited to the ground potential by the plurality of via conductors 230 and 240, and both ends of the resonator 30 are short-circuited to the ground potential by the plurality of via conductors 330 and 340.

Here, the via conductor has an inductance component and a resistance component in a high frequency band. This directly affects change in the resonant frequency of the resonator and increase in insertion loss. However, the par-allel connection structure of the plurality of via conductors makes it possible to stably reduce the inductance component and the resistance component of the conductor portion coupled to the ground potential. Therefore, the filter 10 may suppress the change in the resonance frequency and the increase in the insertion loss due to the short-circuit structure to the ground potential, and may realize more stable filter characteristics.

In the filter 10, the plurality of capacitor elements are lumped constant chip capacitor elements. The lumped con-stant chip capacitor elements have a relatively large pure resistance component as the frequency increases. Therefore, the filter 10 has a larger resistance component as the frequency increases in the resonators 20 and 30. As a result, the filter 10 may improve the attenuation characteristics on the high-frequency side rather than the passband.

Figures 8, 9:
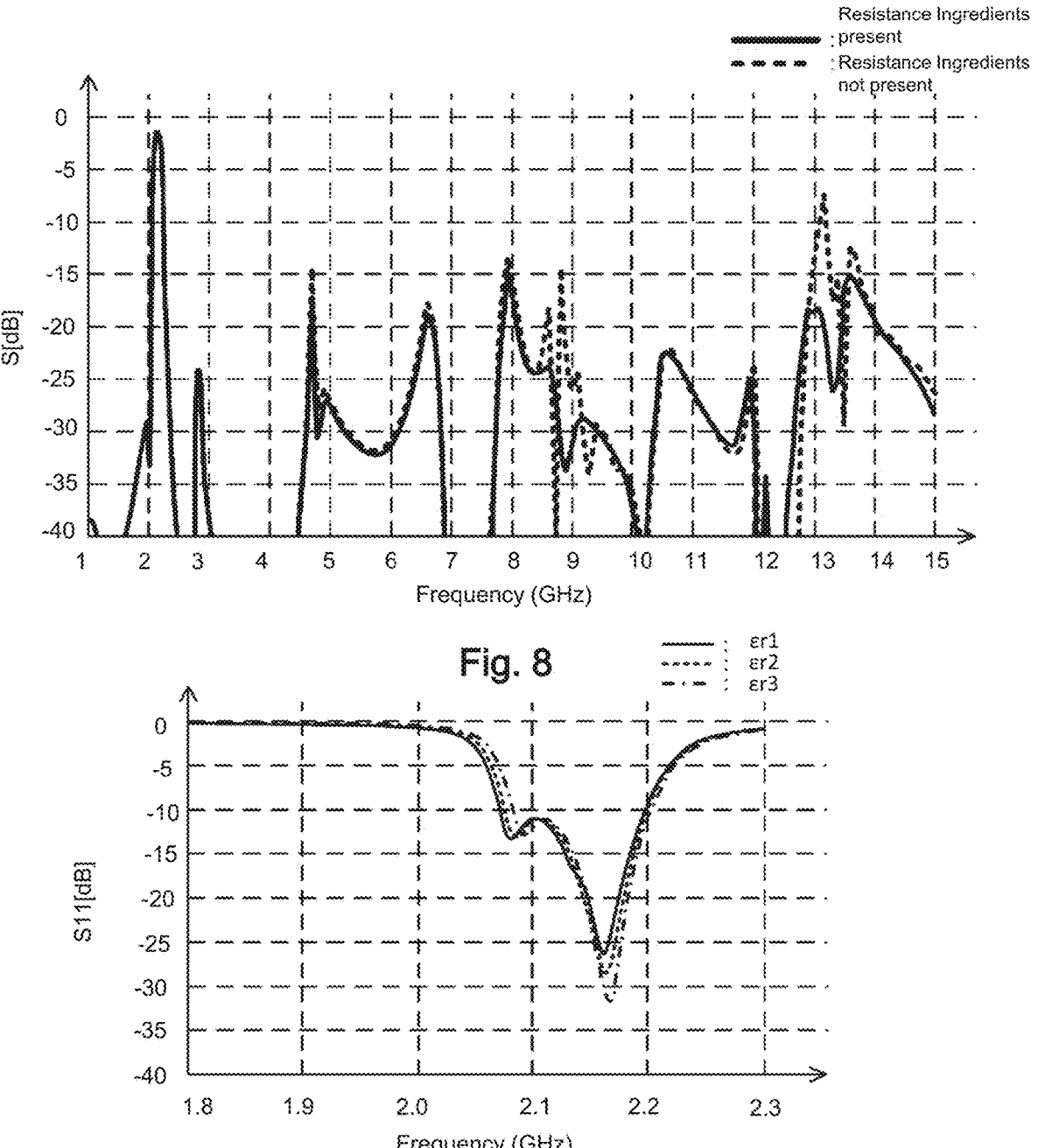
FIG. 8 is a graph showing differences in characteristics of a capacitor element with and without a resistive component.
FIG. 9 is a graph showing S11 characteristics at multiple dielectric constants.

FIG. 7 is a graph showing S11 characteristics and S21 characteristics of the filter according to the embodiment of the present disclosure. FIG. 7 is a graph including a higher frequency band than FIG. 6. FIG. 8 is a graph showing a difference in characteristics depending on the presence or absence of a resistance component in the capacitor element.

As shown in FIG. 7, by providing the structure of the filter 10, S21 is suppressed on the high-frequency side of the passband, particularly in the frequency bands of 6.8 GHZ, 8

GHZ, 13 GHZ, and −14 GHz in this case. Furthermore, as shown in FIG. 8, S21 is suppressed in the frequency bands of 4.6 GHZ, 8.6-9.1 GHZ, and 13-14 GHz. This is due to the resistance components of the plurality of capacitor elements. In other words, the increase in the amount of power passing by the higher-order resonance modes is suppressed by the resistance components in the capacitor. In this way, as may be seen from FIGS. 7 and 8, the filter 10 may suppress the frequency components higher than the passband. For example, the filter 10 may suppress the frequency components that may become harmonic components with respect to the passband frequency. In other words, the filter 10 may suppress the propagation of the higher-order resonance modes other than the desired frequency (the passband frequency).

In the filter 10, the plurality of capacitor elements are chip type capacitor elements having a lumped constant. Thus, the capacitance component of the series resonance circuit may be realized without using a structure in which the capacitance depends on the dielectric constant of the dielectric substrate 90, for example, a structure in which a conductor pattern of an interdigital type (a structure in which comb-shaped electrodes face each other) is formed on the dielectric substrate 90 to realize a capacitor.

Figure 10:
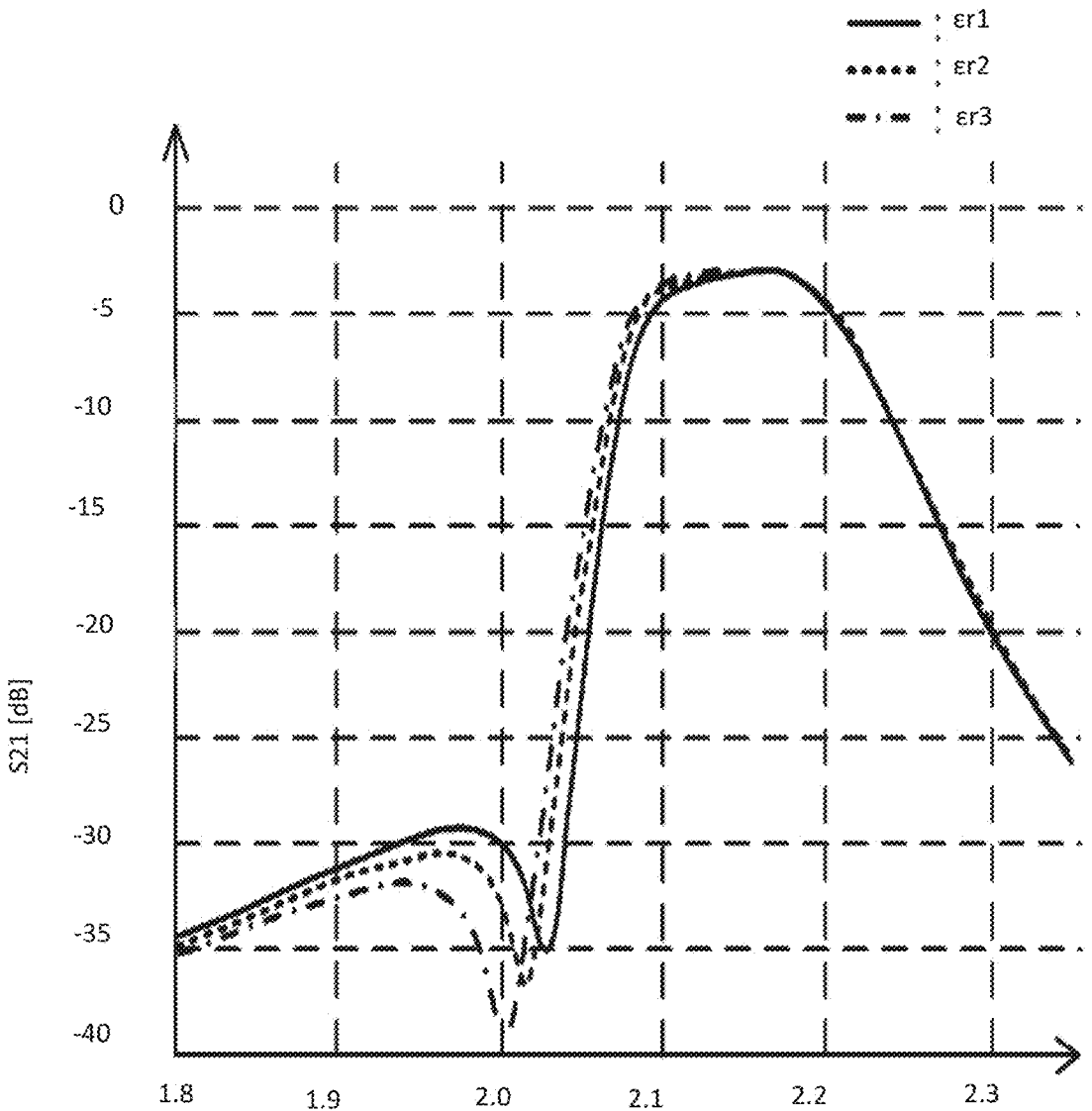
FIG. 10 is a graph showing S21 characteristics at multiple dielectric constants.

FIG. 9 is a graph showing S11 characteristics at a plurality of dielectric constants. FIG. 10 is a graph showing S21 characteristics at a plurality of dielectric constants. In FIGS. 9 and 10, the relative dielectric constants εr1, εr2, and εr3 are respectively different.

By providing the structure of the filter 10, as shown in FIG. 9, the frequency and waveform of the pole of S11 hardly change. Moreover, as shown in FIG. 10, the frequency of the low loss region, the frequency width, and the attenuation amount of the attenuation region of S21 hardly change.

This is because the resonant frequency of the resonator is made to depend on the capacitance of the lumped constant capacitor element, whereby the filter 10 may suppress the influence of the dielectric constant of the dielectric substrate 90 and may realize stable filter characteristics.

In the filter 10, the phase adjustment lines 41 and 42 are formed in a meander shape. Thus, a structure for increasing the feed phase difference between the resonators 20 and 30 may be realized in a small size. Further, the long side direction of the meander shape of the phase adjustment lines 41 and 42 are parallel to the extending direction of the resonators 20 and 30. Thus, the filter 10 may realize a structure for increasing the feed phase difference between the resonators 20 and 30 in a smaller size.

The filter 10 having the structure described above is used, for example, in a transmission circuit or a reception circuit of a radar device. Thus, the radar device may transmit a high frequency without unnecessary waves or may suppress unnecessary waves included in the received signal.

It should be noted that, in the above description, the filter 10 has a configuration (a filter with two stages of resonators) in which two resonators 20 and 30 are coupled in parallel. However, the resonators may have one stage or three or more stages.

Further, in the above description, the resonators 20 and 30 have a configuration with two rows of series resonance circuits. However, the number of series resonance circuits constituting the resonators 20 and 30 are not limited to two rows.

Further, in the above description, the configuration with the phase adjustment lines 41 and 42 has been shown. However, the phase adjustment lines 41 and 42 may be omitted depending on the filter characteristics required by the filter 10. The phase adjustment lines 41 and 42 are not limited to a conductor having a meander shape.

Further, in the above description, an example in which both ends of the two series resonance circuits constituting the resonator are directly coupled has been described. However, it is also possible to realize a configuration similar to that in which both ends of the two series resonance circuits constituting the resonator are directly coupled by coupling lines having the same electric length (phase amount) to each of the two series resonant circuits and coupling these coupling lines.

It is to be understood that not necessarily all objects or advantages may be achieved in accordance with any particular embodiment described herein. Thus, for example, those skilled in the art will recognize that certain embodiments may be configured to operate in a manner that achieves or optimizes one advantage or group of advantages as taught herein without necessarily achieving other objects or advantages as may be taught or suggested herein.

All of the processes described herein may be embodied in, and fully automated via, software code modules executed by a computing system that includes one or more computers or processors. The code modules may be stored in any type of non-transitory computer-readable medium or other computer storage device. Some or all the methods may be embodied in specialized computer hardware.

Many other variations than those described herein will be apparent from this disclosure. For example, depending on the embodiment, certain acts, events, or functions of any of the algorithms described herein can be performed in a different sequence, can be added, merged, or left out altogether (e.g., not all described acts or events are necessary for the practice of the algorithms). Moreover, in certain embodiments, acts or events can be performed concurrently, e.g., through multi-threaded processing, interrupt processing, or multiple processors or processor cores or on other parallel architectures, rather than sequentially. In addition, different tasks or processes can be performed by different machines and/or computing systems that can function together.

The various illustrative logical blocks and modules described in connection with the embodiments disclosed herein can be implemented or performed by a machine, such as a processor. A processor can be a microprocessor, but in the alternative, the processor can be a controller, microcontroller, or state machine, combinations of the same, or the like. A processor can include electrical circuitry configured to process computer-executable instructions. In another embodiment, a processor includes an application specific integrated circuit (ASIC), a field programmable gate array (FPGA) or other programmable device that performs logic operations without processing computer-executable instructions. A processor can also be implemented as a combination of computing devices, e.g., a combination of a digital signal processor (DSP) and a microprocessor, a plurality of microprocessors, one or more microprocessors in conjunction with a DSP core, or any other such configuration. Although described herein primarily with respect to digital technology, a processor may also include primarily analog components. For example, some or all of the signal processing algorithms described herein may be implemented in analog circuitry or mixed analog and digital circuitry. A computing environment can include any type of computer system, including, but not limited to, a computer system based on a microprocessor, a mainframe computer, a digital signal processor, a portable computing device, a device controller, or a computational engine within an appliance, to name a few.

Conditional language such as, among others, "can," "could," "might" or "may," unless specifically stated otherwise, are otherwise understood within the context as used in general to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment.

Disjunctive language such as the phrase "at least one of X, Y, or Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

Any process descriptions, elements or blocks in the flow diagrams described herein and/or depicted in the attached figures should be understood as potentially representing modules, segments, or portions of code which include one or more executable instructions for implementing specific logical functions or elements in the process. Alternate implementations are included within the scope of the embodiments described herein in which elements or functions may be deleted, executed out of order from that shown, or discussed, including substantially concurrently or in reverse order, depending on the functionality involved as would be understood by those skilled in the art.

Unless otherwise explicitly stated, articles such as "a" or "an" should generally be interpreted to include one or more described items. Accordingly, phrases such as "a device configured to" are intended to include one or more recited devices. Such one or more recited devices can also be collectively configured to carry out the stated recitations. For example, "a processor configured to carry out recitations A, B and C" can include a first processor configured to carry out recitation A working in conjunction with a second processor configured to carry out recitations B and C. The same holds true for the use of definite articles used to introduce embodiment recitations. In addition, even if a specific number of an introduced embodiment recitation is explicitly recited, those skilled in the art will recognize that such recitation should typically be interpreted to mean at least the recited number (e.g., the bare recitation of "two recitations," without other modifiers, typically means at least two recitations, or two or more recitations).

It will be understood by those within the art that, in general, terms used herein, are generally intended as "open" terms (e.g., the term "including" should be interpreted as "including but not limited to," the term "having" should be interpreted as "having at least," the term "includes" should be interpreted as "includes but is not limited to," etc.).

For expository purposes, the term "horizontal" as used herein is defined as a plane parallel to the plane or surface of the floor of the area in which the system being described is used or the method being described is performed, regardless of its orientation. The term "floor" can be interchanged with the term "ground" or "water surface." The term "vertical" refers to a direction perpendicular to the horizontal as just defined. Terms such as "above," "below," "bottom,"

"top," "side," "higher," "lower," "upper," "over," and "under," are defined with respect to the horizontal plane.

As used herein, the terms "attached," "connected," "mated," and other such relational terms should be construed, unless otherwise noted, to include removable, moveable, fixed, adjustable, and/or releasable connections or attachments. The connections/attachments can include direct connections and/or connections having intermediate structure between the two components discussed.

Numbers preceded by a term such as "approximately," "about," and "substantially" as used herein include the recited numbers, and also represent an amount close to the stated amount that still performs a desired function or achieves a desired result. For example, the terms "approximately," "about," and "substantially" may refer to an amount that is within less than 10% of the stated amount. Features of embodiments disclosed herein preceded by a term such as "approximately," "about," and "substantially" as used herein represent the feature with some variability that still performs a desired function or achieves a desired result for that feature.

It should be emphasized that many variations and modifications may be made to the above-described embodiments, the elements of which are to be understood as being among other acceptable examples. All such modifications and variations are intended to be included herein within the scope of this disclosure and protected by the following claims.

What is claimed is:

1. A bandpass filter, comprising:
a first strip line configured to transmit electromagnetic wave, the first strip line being formed on a dielectric substrate;
a resonator configured to comprise a first series resonance circuit coupled to the first strip line, the resonator being formed on the dielectric substrate; and
a second strip line configured to couple to the resonator, the second strip line being formed on the dielectric substrate,
wherein the first series resonance circuit comprises:
a plurality of inductor elements each configured to comprise a rectangular conductor having a length in a long side direction equal to or less than a half wavelength of the electromagnetic wave; and
a mount type capacitor element placed between the plurality of inductor elements and coupled in series to the plurality of inductor elements.

2. The bandpass filter of claim 1,
wherein a length of a long side of a resonator unit cell comprising an inductor element of the plurality of inductor elements and the capacitor element is equal to or less than half the wavelength of the electromagnetic wave.

3. The bandpass filter of claim 1,
wherein a terminal of the capacitor element is coupled in a vicinity of a short side of an inductor element of the plurality of inductor elements.

4. The bandpass filter of claim 1,
wherein the resonator further comprises:
a second series resonance circuit parallel to the first series resonance circuit along the long side direction.

5. The bandpass filter of claim 4,
wherein both ends of the first series resonance circuit and the second series resonance circuit are coupled to a ground potential.

6. The bandpass filter of claim 1, wherein the first strip line and the second strip line are further configured to have a shape extending along the long side direction.

7. The bandpass filter of claim 4, wherein the resonator further comprises:

a first resonator configured to comprise the first series resonance circuit and the second series resonance circuit; and a second resonator configured to have a configuration equivalent to that of the first resonator, wherein the first resonator and the second resonator are coupled with the first strip line and the second strip line, the first resonator and the second resonator being coupled in parallel.

8. The bandpass filter of claim 7, wherein the first strip line further comprises:

a first coupling line configured to couple to the first resonator;

a second coupling line configured to couple to the second resonator; and a first phase adjustment line configured to couple between the first coupling line and the second coupling line.

9. The bandpass filter of claim 8, wherein the second strip line further comprises:

a third coupling line configured to couple to the first resonator;

a fourth coupling line configured to couple to the second resonator; and a second phase adjustment line configured to couple between the third coupling line and the fourth coupling line.

10. The bandpass filter of claim 9, wherein the first phase adjustment line and the second phase adjustment line are conductors further configured to have a meander shape.

11. A radar device comprising the bandpass filter of claim 1.

12. The bandpass filter of claim 5, wherein the first strip line and the second strip line are further configured to have a shape extending along the long side direction.

\* \* \* \* \*